US012755792B2

(12) United States Patent
Yip

(10) Patent No.: US 12,755,792 B2
(45) Date of Patent: Oct. 6, 2026

(54) USING NON-SEGREGATED CELLS AS DRAIN-SIDE SELECT GATES FOR SUB-BLOCKS IN A MEMORY DEVICE

(71) Applicant: Micron Technology, Inc., Boise, ID (US)

(72) Inventor: Aaron S. Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 32 days.

(21) Appl. No.: 18/787,957

(22) Filed: Jul. 29, 2024

(65) Prior Publication Data

US 2024/0386965 A1 Nov. 21, 2024

Related U.S. Application Data

(63) Continuation of application No. 17/944,940, filed on Sep. 14, 2022, now Pat. No. 12,080,351.

(60) Provisional application No. 63/262,204, filed on Oct. 7, 2021.

(51) Int. Cl.

*G11C 16/34* (2006.01)
*G11C 16/04* (2006.01)
*G11C 16/08* (2006.01)
*G11C 16/10* (2006.01)

(52) U.S. Cl.

CPC ........ *G11C 16/102* (2013.01); *G11C 16/0433* (2013.01); *G11C 16/08* (2013.01); *G11C 16/34* (2013.01)

(58) Field of Classification Search

CPC ...................................................... G11C 16/34
See application file for complete search history.

(56) References Cited

U.S. PATENT DOCUMENTS

| | | | |
|---|---|---|---|
| 10,910,060 B1 | 2/2021 | Wu et al. | |
| 2016/0055911 A1 | 2/2016 | Nguyen et al. | |
| 2018/0190358 A1 | 7/2018 | Kim | |
| 2019/0147954 A1 | 5/2019 | Yip | |
| 2021/0174887 A1* | 6/2021 | Sanada | G11C 16/0483 |

FOREIGN PATENT DOCUMENTS

| | | |
|---|---|---|
| CN | 103177762 A | 6/2013 |
| CN | 111354401 A | 6/2020 |
| CN | 113096712 B | 4/2025 |

OTHER PUBLICATIONS

Office Action for Chinese Patent Application No. 202211217556.7, mailed Jun. 20, 2025, 9 Pages.

* cited by examiner

*Primary Examiner* — Jason Lappas
(74) *Attorney, Agent, or Firm* — Lowenstein Sandler LLP

(57) ABSTRACT

Control logic in a memory device receives a request to program data to a block of a memory array of the memory device, the block comprising a plurality of sub-blocks, and identifies a first sub-block of the plurality of sub-blocks to be programmed with at least a portion of the data. The control logic further causes a plurality of control signals to be applied to a plurality of logical select gate layers positioned at a drain-side of the block to activate the first sub-block, and causes a program signal to be applied to a selected wordline of the block to program at least the portion of the data to a memory cell in the first sub-block and associated with the selected wordline.

20 Claims, 6 Drawing Sheets

USING NON-SEGREGATED CELLS AS DRAIN-SIDE SELECT GATES FOR SUB-BLOCKS IN A MEMORY DEVICE

RELATED APPLICATION

This application is a continuation application of co-pending U.S. patent application Ser. No. 17/944,940, filed Sep. 14, 2022, which claims the benefit of U.S. Provisional Patent Application Ser. No. 63/262,204, filed Oct. 7, 2021, each of which are hereby incorporated by reference herein.

TECHNICAL FIELD

Embodiments of the disclosure relate generally to memory sub-systems, and more specifically, relate to using non-segregated cells as a drain-side select gates for sub-blocks in a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
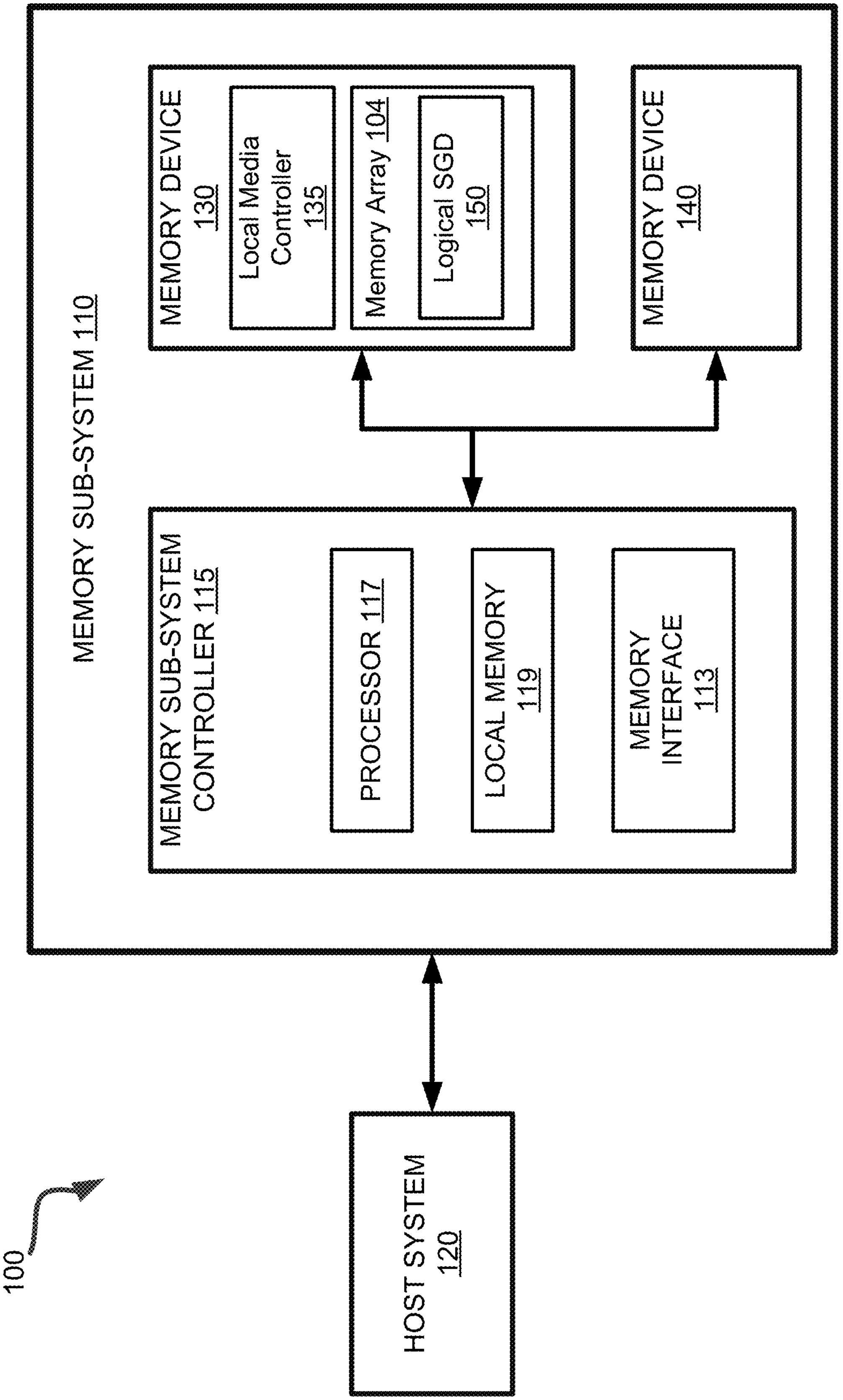
FIG. 1A illustrates an example computing system that includes a memory sub-system in accordance with some embodiments of the present disclosure.

Aspects of the present disclosure are directed to using non-segregated cells as a drain-side select gates for sub-blocks in a memory device of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

Memory pages (also referred to herein as "pages") store one or more bits of binary data corresponding to data received from the host system. The memory cells of a block can be arranged along a number of separate wordlines. Each block can include a number of sub-blocks, where each sub-block is defined by an associated pillar (e.g., a vertical conductive trace) extending from a shared bitline. Since the sub-blocks can be accessed separately (e.g., to perform program or read operations), the block can include a structure to selectively enable the pillar associated with a certain sub-block, while disabling the pillars associated with other sub-blocks. This structure can include one or more select gate devices positioned at either or both ends of each pillar. Depending on a control signal applied, these select gate devices can either enable or disable the conduction of signals through the pillars.

Certain memory devices can implement these select gate devices using core memory cells (e.g., replacement gate transistors with a charge trapping structure). The replacement gate transistors are programmable devices and thus offer the benefit of high versatility when setting corresponding threshold voltages for the select gate devices. In general, the select gate devices associated with each pillar in the data block are controlled separately (e.g., by separate control signals) and the select gate devices themselves are physically segregated. Often, there is a cut or slit in the memory array (e.g., at a drain-side of the pillars) to physically delineate the select gate devices in separate sub-blocks from one another. Core memory cells are relatively large, however, and the pillar at the drain-end is relatively wide when the pillar is formed in a single processing step, leaving little space between sub-blocks to make such a physical cut or slit. Accordingly, other memory devices use different transistors (e.g., NMOS transistors) to form the select gate devices. Such transistors are smaller than core memory cells and can be deintegrated at the drain-end of the pillars (i.e., located at a portion of the pillar that is formed as a separate processing step from the rest of the pillar where the core memory cells are located). The threshold voltages of NMOS transistors are not programmable, however, and are fixed at the time of manufacture. This can lead to variations among the select gate devices in different sub-blocks, potentially causing reliability problems in the data stored in those sub-blocks.

Aspects of the present disclosure address the above and other deficiencies by using non-segregated cells as a drain-side select gates for sub-blocks in a memory device of a memory sub-system. In one embodiment, a block of the memory device can include a number of sub-blocks (e.g., four sub-blocks) and the same or a greater number of logical select gate layers (e.g., four layers) at a drain-side of the sub-blocks. Each of the logical select gate layers can include one select gate device associated with each sub-block, and each sub-block can be associated with one select gate device in each of the logical select gate layers. In one embodiment, the select gate devices in each layer are formed using core memory cells (e.g., replacement gate transistors with a charge trapping structure) and are non-segregated, such that they are each coupled to a shared wordline and controlled by a same control signal. In one embodiment, the select gate devices in the logical select gate layers are programmed with threshold voltages in a certain pattern such that the application of control signals having specific voltages on the wordlines can selectively activate one of the sub-blocks at a time. For example, each logical select gate layer can have half of the select gate devices (e.g., two select gate devices) programmed with a high threshold voltage and half of the select gate devices (e.g., two select gate devices) programmed with a low threshold voltage, while each sub-block has select gate devices in half of the logical select gate layers programmed with the high threshold voltage and select gate devices in half of the logical select gate layers programmed with the low threshold voltage. In one embodiment, the block of the memory device can further include a logical select gate control layer including select gate devices associated with each sub-block to provide activation controls at the block level. The logical select gate control layer can be located further from the drain-side edge of the memory array than the logical select gate layers and can include select gate devices with more finely tuned threshold voltages that the select gate devices in the logical select gate layers, which can be more coarsely programmed. In addition, the block of the memory device can further include segregated select gate devices at the source-side of each sub-block. These source-side select gate devices can be physically segregated by a cut or slice, can be formed using a different technology (e.g., NMOS transistors) than the core memory cells, and can be deintegrated at the source-end of the sub-block pillars (i.e., located at a portion of the pillar that is formed as a separate processing step from the rest of the pillar where the core memory cells are located). The source-side select gate devices can be used to selectively activate different sub-blocks during programming of the drain-side select gate devices in the logical select gate layers into the specific pattern of threshold voltages.

Advantages of this approach include, but are not limited to, are savings in the memory device. Since the select gate devices in the logical select gate layers need not be physically segregated, a cut or slit between sub-blocks is not required at the drain-side of the memory array. As a result the spacing between the sub-blocks can be reduced, leading to a decreased width of each block. In addition, core memory cells can be in the logical select gate layers which offer the benefit of programmable threshold voltages over the smaller NMOS transistors. Accordingly, the threshold voltages can be more accurately tuned, leading to improved performance in the memory device.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative- or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. In some embodiments, the memory sub-system controller 115 includes at least a portion of the memory interface 113. For example, the memory sub-system controller 115 can include a processor 117 (e.g., a processing device) configured to execute instructions stored in local memory 119 for performing the operations described herein. In some embodiments, the memory interface component 113 is part of the host system 110, an application, or an operating system.

In one embodiment, memory device 130 includes local media controller 135 and a memory array 104. As described herein, the memory array 104 can include a number of blocks, where each block includes a number of sub-blocks. In one embodiment, each block includes a number of logical select gate layers (logical SGD) 150 at a drain-side of the sub-blocks. The number of logical select gate layers 150 can be greater than or equal to the number of sub-blocks. For example, if a block includes four sub-blocks, there can be four logical select gate layers 150. Similarly, if a block includes eight sub-blocks, there can be eight logical select gate layers 150. In addition, if a block includes three sub-blocks, there could still be four logical select gate layers, for example. In one embodiment, the select gate devices in each layer are formed using core memory cells (e.g., replacement gate transistors with a charge trapping structure) and are non-segregated, such that they are each coupled to a shared wordline and controlled by a same control signal. In one embodiment, the select gate devices in the logical select gate layers 150 are programmed with threshold voltages in a certain pattern such that the application of control signals from local media controller 135 having specific voltages on the wordlines can selectively activate one of the sub-blocks at a time. For example, each logical select gate layer can have half of the select gate devices programmed with a high threshold voltage and half of the select gate devices programmed with a low threshold voltage, while each sub-block has select gate devices in half of the logical select gate layers programmed with the high threshold voltage and select gate devices in half of the logical select gate layers programmed with the low threshold voltage. Further details with regards to the structure and operation of the logical select gate layers 150 are described below.

Figure 1B:
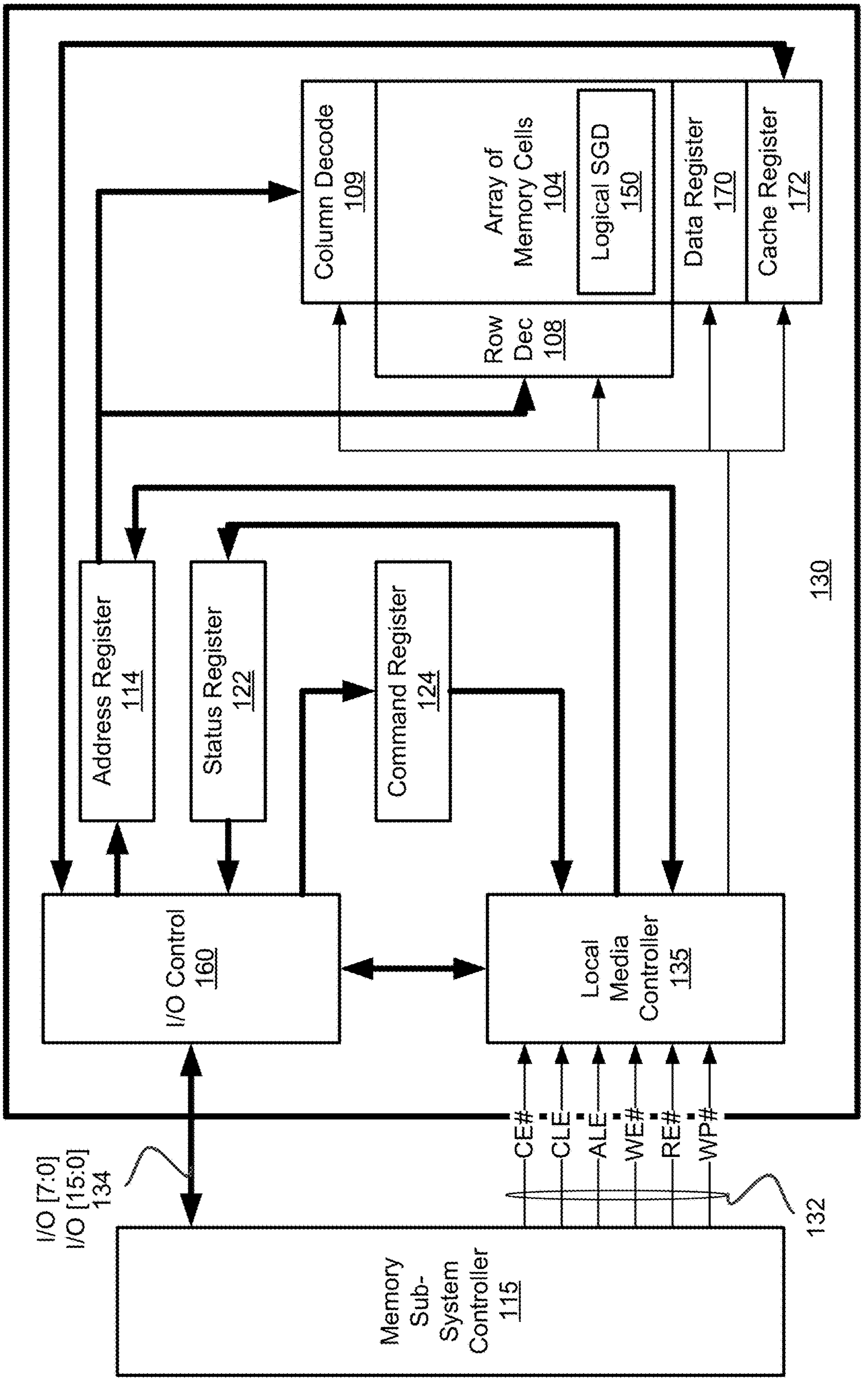
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states. In one embodiment, the memory array 104 includes a number of logical select gate layers (logical SGD) 150 at a drain-side of each sub-block in the array 104.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 160 and may then be written into command register 124. The addresses may be received over input/output (I/O) pins [7:0] of I/O bus 134 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
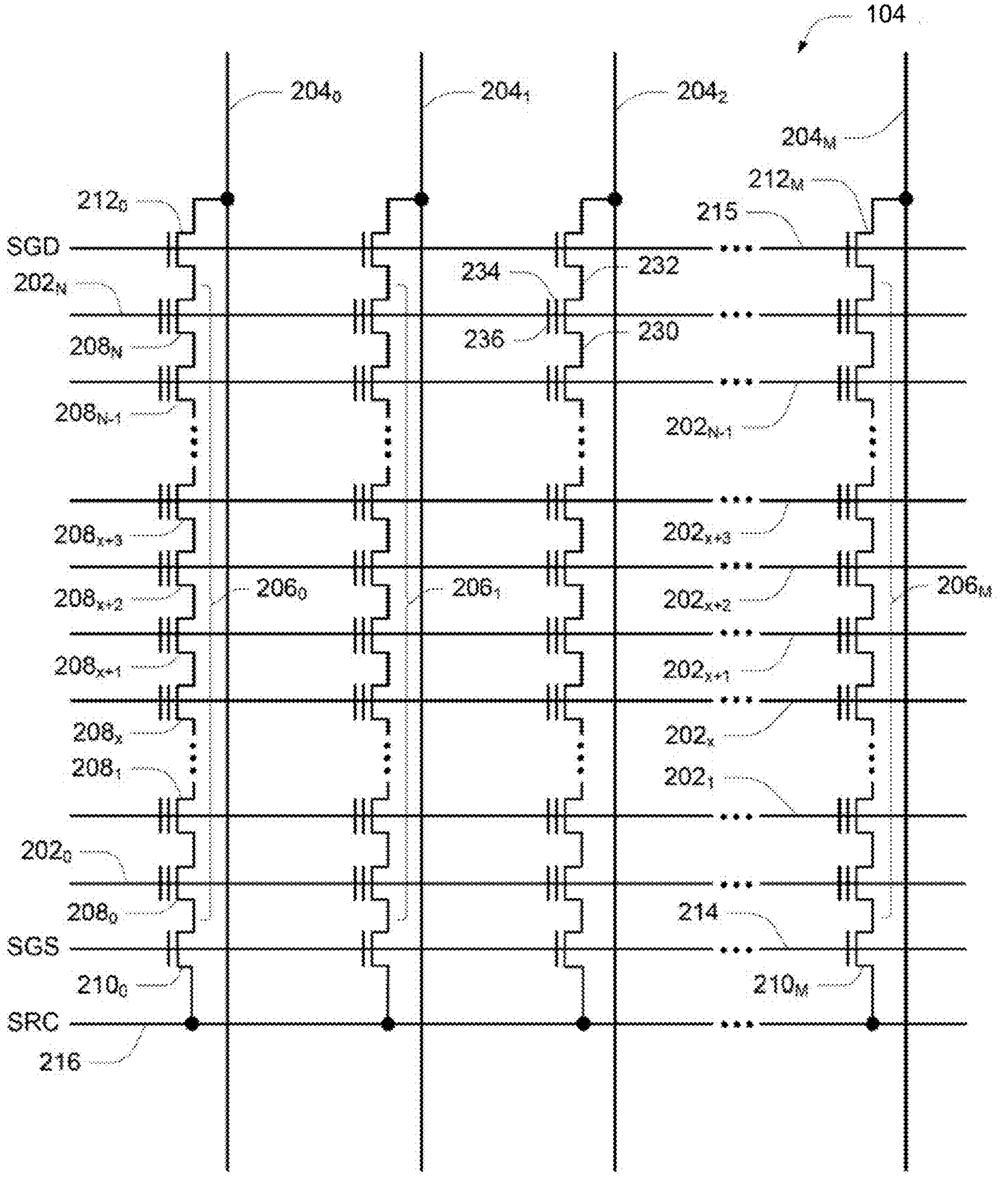
FIG. 2 is a schematic of portions of an array of memory cells as could be used in a memory of the type described with reference to FIG. 1B in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines 202$_0$ to 202$_N$, and data lines, such as bit lines 204$_0$ to 204$_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells), such as one of NAND strings 206$_0$ to 206$_M$. Each NAND string 206 can be connected (e.g., selectively connected) to a common source (SRC) 216 and can include memory cells 208$_0$ to 208$_N$. The memory cells 208 can represent non-volatile memory cells for storage of data. The memory cells 208 of each NAND string 206 can be connected in series between a select gate 210 (e.g., a field-effect transistor), such as one of the select gates 210$_0$ to 210$_M$ (e.g., that can be source select transistors, commonly referred to as select gate source), and a select gate 212 (e.g., a field-effect transistor), such as one of the select gates 212$_0$ to 212$_M$ (e.g., that can be drain select transistors, commonly referred to as select gate drain). Select gates 210$_0$ to 210$_M$ can be commonly connected to a select line 214, such as a source select line (SGS), and select gates 212$_0$ to 212$_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell 208$_0$ of the corresponding NAND string 206. For example, the drain of select gate 210$_0$ can be connected to memory cell 208$_0$ of the corresponding NAND string 206$_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate 212$_0$ can be connected to the bit line 204$_0$ for the corresponding NAND string 206$_0$. The source of each select gate 212 can be connected to a memory cell 208$_N$ of the corresponding NAND string 206. For example, the source of select gate 212$_0$ can be connected to memory cell 208$_N$ of the corresponding NAND string 206$_0$. Therefore, each select gate 212 can be configured to selectively connect a corresponding NAND string 206 to the corresponding bit line 204. A control gate of each select gate 212 can be connected to select line 215.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $\mathbf{202}_N$ and selectively connected to even bit lines 204 (e.g., bit lines $\mathbf{204}_0$, $\mathbf{204}_2$, $\mathbf{204}_4$, etc.) can be one physical page of the memory cells 208 (e.g., even memory cells) while memory cells 208 commonly connected to wordline $\mathbf{202}_N$ and selectively connected to odd bit lines 204 (e.g., bit lines $\mathbf{204}_1$, $\mathbf{204}_3$, $\mathbf{204}_5$, etc.) can be another physical page of the memory cells 208 (e.g., odd memory cells).

Although bit lines $\mathbf{204}_3$-$\mathbf{204}_5$ are not explicitly depicted in FIG. 2, it is apparent from the figure that the bit lines 204 of the array of memory cells 104 can be numbered consecutively from bit line $\mathbf{204}_0$ to bit line $\mathbf{204}_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $\mathbf{202}_0$-$\mathbf{202}_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
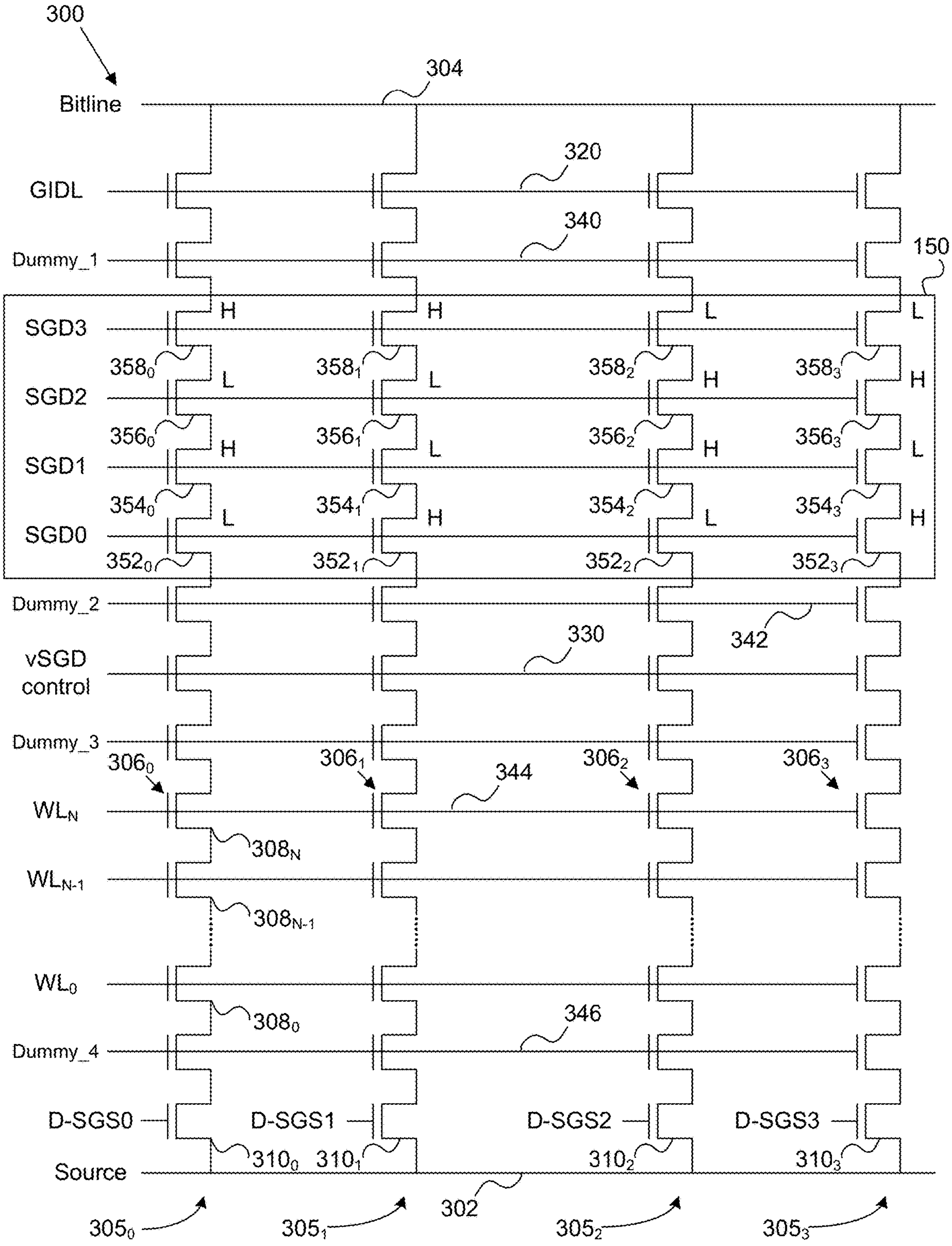
FIG. 3 is a schematic of portions of an array of memory cells implementing non-segregated cells as a drain-side select gates for sub-blocks in accordance with some embodiments of the present disclosure.

FIG. 3 is a schematic of portions of an array of memory cells implementing non-segregated cells as a drain-side select gates for sub-blocks in accordance with some embodiments of the present disclosure. The portion of the array of memory cells, such as memory array 104, can be a block 300, for example. In one embodiment, the block 300 includes strings of memory cells that can be grouped into sub-blocks, such as sub-blocks $\mathbf{305}_0$-$\mathbf{305}_3$. Other numbers of sub-blocks can be included in other embodiments.

Specifically, in at least some embodiments, the block 300 includes a bit line 304, where each sub-block is coupled to the bit line 304, and a common source (SRC), such as a source voltage line 302. The first sub-block $\mathbf{305}_0$ can include a first string of memory cells $\mathbf{306}_0$ coupled therebetween. The second sub-block $\mathbf{305}_1$ can include a second string of memory cells $\mathbf{306}_1$ coupled therebetween. The third sub-block $\mathbf{305}_2$ can include a third string of memory cells $\mathbf{306}_2$ coupled therebetween. The fourth sub-block $\mathbf{305}_3$ can include a fourth string of memory cells $\mathbf{306}_3$ coupled therebetween. By way of example, the first string of memory cells $\mathbf{306}_0$ includes multiple memory cells $\mathbf{308}_0 \ldots \mathbf{308}_N$. In at least some embodiments, multiple wordlines (WLs) are coupled with gates of memory cells of each string of memory cells $\mathbf{306}_0 \ldots \mathbf{306}_3$. Each sub-block also includes a respective source select (SGS) transistor $\mathbf{310}_0$-$\mathbf{310}_3$. Each SGS transistor can be connected to the common source, to provide voltage to the sources of the multiple memory cells $\mathbf{308}_0 \ldots \mathbf{308}_N$. In some embodiments, the source voltage line 302 includes a source plate that supplies the source voltage. In one embodiment, the SGS transistors $\mathbf{310}_0$-$\mathbf{310}_3$ can be physically segregated by a cut or slice, can be formed using a different technology (e.g., NMOS transistors) than the memory cells $\mathbf{308}_0 \ldots \mathbf{308}_N$, and can be deintegrated from the sub-block pillars (i.e., located at a portion of the pillar that is formed as a separate processing step from the rest of the pillar where the memory cells $\mathbf{308}_0 \ldots \mathbf{308}_N$ are located). In one embodiment, a first source select gate line (D-SGS0) can be connected to the gate of the first SGS transistor $\mathbf{310}_0$, a second source select gate line (D-SGS1) can be connected to the gate of the second SGS transistor $\mathbf{310}_1$, a third source select gate line (D-SGS2) can be connected to the gate of the third SGS transistor $\mathbf{310}_2$, and a fourth source select gate line (D-SGS3) can be connected to the gate of the fourth SGS transistor $\mathbf{310}_3$.

In one embodiment, block 300 includes one or more drain-side gate induced drain leakage generator layers 320 having one or more gate induced drain leakage generator devices associated with respective sub-blocks $\mathbf{305}_0$-$\mathbf{305}_3$ and coupled to bit line 304. The gate induced drain leakage generator devices in each layer can be connected to a common gate line GIDL, for example.

In one embodiment, block 300 includes a number of logical select gate layers 150 including select gate devices associated with respective sub-blocks $\mathbf{305}_0$-$\mathbf{305}_3$. The number of logical select gate layers 150 can be greater than or equal to the number of sub-blocks $\mathbf{305}_0$-$\mathbf{305}_3$. In one embodiment, the select gate devices in each of the logical select gate layers 150 are formed using core memory cells (e.g., replacement gate transistors with a charge trapping structure) and are non-segregated, such that devices in each layer are each coupled to a shared wordline and controlled by a same respective control signal (e.g., SGD0, SGD1, SGD2, SGD3).

In one embodiment, block 300 includes one or more logical select gate control layers 330 having one or more select gate devices associated with respective sub-blocks $\mathbf{305}_0$-$\mathbf{305}_3$. The select gate devices in each layer can be connected to a common gate line vSGD control, for example. The logical select gate control layer 330 can be located further from the drain-side edge of the block 300 than the logical select gate layers and can include select gate devices with more finely tuned threshold voltages that the select gate devices in the logical select gate layers, which can be more coarsely programmed. In certain implementations, there can be more than one logical select gate control layer in block 300. In addition, the logical select gate control layer(s) could instead be positioned directly above strings of memory cells $\mathbf{306}_0 \ldots \mathbf{306}_3$ or there could be additional logical select gate control layers positioned directly above strings of memory cells $\mathbf{306}_0 \ldots \mathbf{306}_3$ (e.g., below dummy wordline Dummy_3 344).

In one embodiment, block 300 includes a number of dummy wordlines located between other layers. For example, dummy wordline Dummy_1 340 can be located between drain-side gate induced drain leakage generator layer 320 and logical select gate layers 150, dummy wordline Dummy_2 342 can be located between logical select gate layers 150 and logical select gate control layer 330, dummy wordline Dummy_3 344 can be located between logical select gate control layer 330 and strings of memory cells $306_0$ . . . $306_3$, and dummy wordline Dummy_4 346 can be located between strings of memory cells $306_0$ . . . $306_3$ and source select transistors $310_0$-$310_3$. Each dummy wordline can include memory cells associated with respective sub-blocks $305_0$-$305_3$, but these memory cells are generally not used for storing data. Depending on the embodiment, there can be more than one dummy wordline at the positions of Dummy_1 340, Dummy_2 342, Dummy_3 344, and/or Dummy_4 346.

In one embodiment, the select gate devices in the logical select gate layers 150 are programmed with threshold voltages in a certain pattern such that the application of control signals (e.g., SGD0, SGD1, SGD2, SGD3) from local media controller 135 having specific voltages on the wordlines can selectively activate one of the sub-blocks $305_0$-$305_3$ at a time. In one embodiment, each of logical select gate layers 150 can have half of the select gate devices programmed with a high threshold voltage and half of the select gate devices programmed with a low threshold voltage, while each of sub-blocks $305_0$-$305_3$ has select gate devices in half of the logical select gate layers 150 programmed with the high threshold voltage and select gate devices in half of the logical select gate layers 150 programmed with the low threshold voltage. One example pattern is illustrated in block 300 of FIG. 3, however, other patterns are possible.

As illustrated, one layer of logical select gate layers 150 (i.e., the layer controlled by SGD0) includes select gate devices $352_0$-$352_3$, where each device is associated with one of sub-blocks $305_0$-$305_3$. In this embodiment, select gate devices $352_1$ and $352_3$ are programmed with the high (H) threshold voltage (e.g., 7V) and select gate devices $352_0$ and $352_2$ are programmed with the low (L) threshold voltage (e.g., 3V). In other embodiments, the high and low threshold voltages can have different values. Another layer of logical select gate layers 150 (i.e., the layer controlled by SGD1) includes select gate devices $354_0$-$354_3$, where each device is associated with one of sub-blocks $305_0$-$305_3$. In this embodiment, select gate devices $354_0$ and $354_2$ are programmed with the high (H) threshold voltage (e.g., 7V) and select gate devices $354_1$ and $354_3$ are programmed with the low (L) threshold voltage (e.g., 3V). Another layer of logical select gate layers 150 (i.e., the layer controlled by SGD2) includes select gate devices $356_0$-$356_3$, where each device is associated with one of sub-blocks $305_0$-$305_3$. In this embodiment, select gate devices $356_2$ and $356_3$ are programmed with the high (H) threshold voltage (e.g., 7V) and select gate devices $356_0$ and $356_1$ are programmed with the low (L) threshold voltage (e.g., 3V). Another layer of logical select gate layers 150 (i.e., the layer controlled by SGD3) includes select gate devices $358_0$-$358_3$, where each device is associated with one of sub-blocks $305_0$-$305_3$. In this embodiment, select gate devices $358_0$ and $358_1$ are programmed with the high (H) threshold voltage (e.g., 7V) and select gate devices $358_2$ and $358_3$ are programmed with the low (L) threshold voltage (e.g., 3V). Accordingly, sub-block $305_0$ includes select gate devices $354_0$ and $358_0$ programmed with the high threshold voltage and select gate devices $352_0$ and $356_0$ programmed with the low threshold voltage. Sub-block $305_1$ includes select gate devices $352_1$ and $358_1$ programmed with the high threshold voltage and select gate devices $354_1$ and $356_1$ programmed with the low threshold voltage. Sub-block $305_2$ includes select gate devices $354_2$ and $356_2$ programmed with the high threshold voltage and select gate devices $351_2$ and $358_2$ programmed with the low threshold voltage. Sub-block $305_3$ includes select gate devices $352_3$ and $356_3$ programmed with the high threshold voltage and select gate devices $354_3$ and $358_3$ programmed with the low threshold voltage.

When the threshold voltages of the select gate devices in logical select gate layers 150 are programmed in this or a similar pattern, the application of control signals (e.g., SGD0, SGD1, SGD2, SGD3) from local media controller 135 can selectively activate one of the sub-blocks $305_0$-$305_3$ at a time. Table 1 illustrates one example of the control signals that can be applied to the wordlines of logical select gate layers 150 in order to activate each specific sub-block.

TABLE 1

| SGD3 | SGD2 | SGD1 | SGD0 | Activated Sub-block |
|---|---|---|---|---|
| 7 V | 3 V | 7 V | 3 V | $305_0$ |
| 7 V | 3 V | 3 V | 7 V | $305_1$ |
| 3 V | 7 V | 7 V | 3 V | $305_2$ |
| 3 V | 7 V | 3 V | 7 V | $305_3$ |

In general, if the control signal applied to a certain wordline has a high voltage (e.g., 7V) then all select gate devices on that wordline with a threshold voltage at or below the high voltage will turn on. Similarly, if the control signal has a low voltage (e.g., 3 V) then only the select gate devices on that wordline with a threshold voltage at the low voltage will turn on, while those select gate devices with a high threshold voltage will remain turned off. By way of example, if it is desired to activate sub-block $305_0$ while sub-blocks $305_1$-$305_3$ remain deactivated, the following set of control signals can be applied to the wordlines of logical select gate layers 150. A high voltage is applied at SGD3 causing select gate device $358_0$ having a high threshold voltage to turn on, a low voltage is applied at SGD2 causing select gate device $356_0$ having a low threshold voltage to turn on, a high voltage is applied at SGD1 causing select gate device $354_0$ having a high threshold voltage to turn on, and a low voltage is applied at SGD0 causing select gate device $352_0$ having a low threshold voltage to turn on. Thus, all of the select gate devices in sub-block $305_0$ are activated. At the same time, however, the low voltage at SGD0 causes select gate device $352_1$ having a high threshold voltage to remain off, thereby deactivating sub-block $305_1$, the low voltage at SGD2 causes select gate device $356_2$ having a high threshold voltage to remain off, thereby deactivating sub-block $305_2$, and the low voltage at SGD0 causes select gate device $352_3$ having a high threshold voltage to remain off, thereby deactivating sub-block $305_3$. Similarly, the other sets of control signals can be applied to the wordlines of logical select gate layers 150 to activate the other sub-blocks.

As described above, the select gate devices in logical select gate layers 150 can be formed using core memory cells, such as replacement gate transistors with a charge trapping structure, and thus, have programmable threshold voltages. In one embodiment, the select gate devices are programmed with a specific threshold voltage pattern using source select transistors $310_0$-$310_3$. For example, to program select gate device $358_0$ (e.g., to a high threshold voltage), local media controller 135 can cause a control signal D-SGS0 to be applied at the gate of the first SGS transistor $310_0$ in sub-block $305_0$ to activate the first SGS transistor $310_0$ and allow a voltage from the source line 302 (e.g., a ground voltage) to fill the channel of sub-block $305_0$. The remaining SGS transistors $310_1$-$310_3$ can remain turned off and thus the channels of sub-blocks $305_1$-$305_3$ will be floating (e.g., up to 10V). Local media controller 135 can further cause a program voltage pulse (e.g., 20V) to be applied to the gate of select gate device 358$_0$ via control signal SGD3. The gate-channel potential difference at select gate device 358$_0$ will be large enough to program select gate device 358$_0$ while the other memory devices in the same logical select gate layer, but associated with different sub-blocks, are not programmed. Depending on the embodiment, a number of program pulses can be applied in order to bring the select gate device 358$_0$ to a desired threshold voltage level (e.g., 7V). A similar process can be repeated for the remaining select gate devices in sub-block 305$_0$ (i.e., select gate devices 356$_0$, 354$_0$, 352$_0$) while the first SGS transistor 310$_0$ in sub-block 305$_0$ remains activated. Once complete, local media controller can move on to sub-block 305$_1$, activate the first SGS transistor 310$_1$, and proceed similarly. Once all of the select gate transistors in logical select gate layers 150 have been programmed to the appropriate pattern of threshold voltages, local media controller can similarly program the devices in logical select gate control layer 330, and the memory cells on wordlines $WL_0$-$WL_N$.

Figure 4:
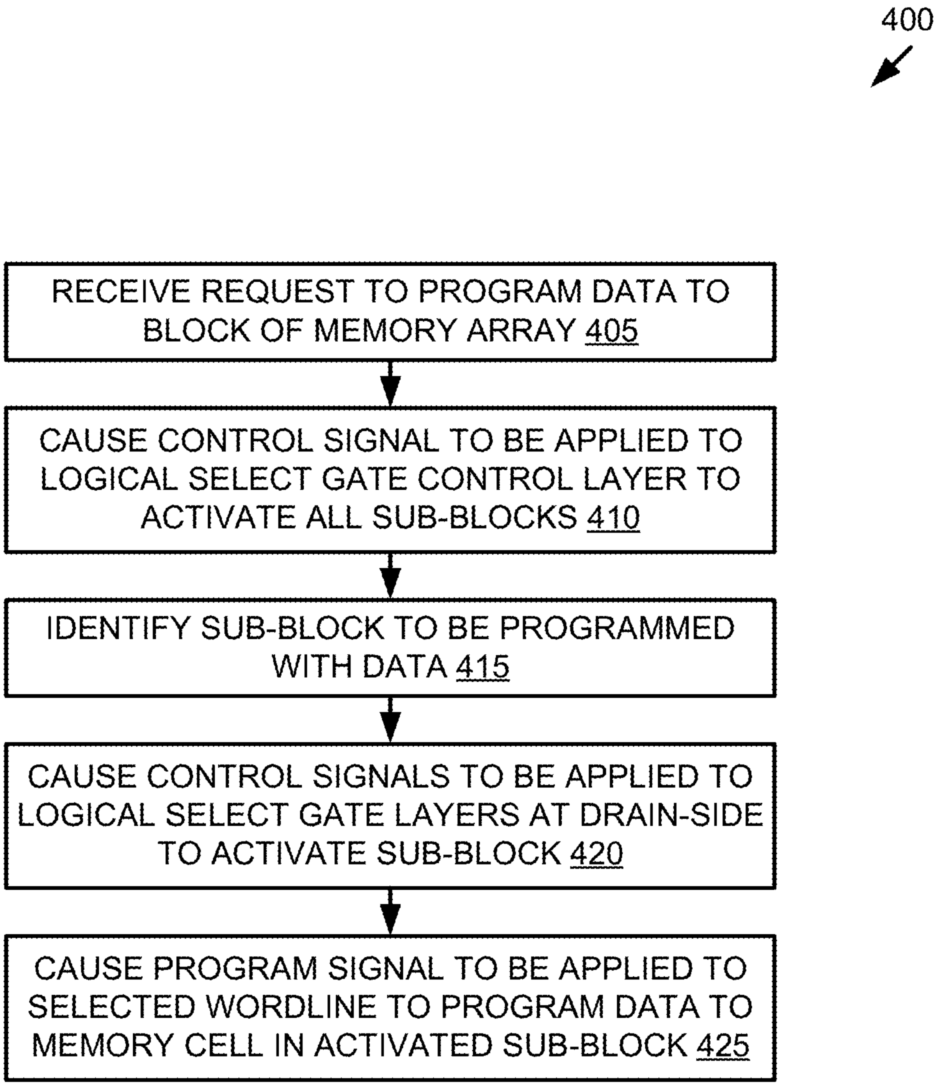
FIG. 4 is a flow diagram of an example method of operation of a memory array implementing non-segregated cells as a drain-side select gates for sub-blocks in accordance with some embodiments of the present disclosure.

FIG. 4 is a flow diagram of an example method of operation of a memory array implementing non-segregated cells as a drain-side select gates for sub-blocks in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, a request is received. For example, control logic (e.g., local media controller 135) can receive, from a requestor, such as a memory interface 113 of a memory sub-system controller 115, a first request to perform a memory access operation on a block of a memory array, such as block 300 of memory array 104. In one embodiment, the memory access operation comprises a program operation. For example, the request can be to program one or more pages of host data to the block 300 of memory array 104.

At operation 410, a control signal is applied. For example, responsive to receiving the request to program the data to the block 300, the control logic can cause a control signal (e.g., vSGD control) to be applied to a logical select gate control layer 330 to activate all of a plurality of sub-blocks 305$_0$-305$_3$ of block 300. In one embodiment, the logical select gate control layer 330 is disposed between a plurality of logical select gate layers 150 and a selected wordline where at least a portion of the data is to be programmed.

At operation 415, a sub-block is identified. For example, the control logic can identify a first sub-block, such as sub-block 305$_0$, of the plurality of sub-blocks 305$_0$-305$_3$ of block 300, to be programmed with at least a portion of the data. Depending on the data to be programmed, any one of sub-blocks 305$_0$-305$_3$ can be selected.

At operation 420, control signals are applied. For example, the control logic can cause a plurality of control signals (e.g., SGD0-SGD3) to be applied to a plurality of logical select gate layers 150 positioned at a drain-side of the block 300 to activate the first sub-block (e.g., sub-block 305$_0$). In one embodiment, the plurality of logical select gate layers 150 are disposed between a common bitline, such as bitline 304, shared by the plurality of sub-blocks 305$_0$-305$_3$ and the selected wordline (e.g., $WL_N$). In one embodiment, a number of logical select gate layers 150 in the block 300 is equal to a number of sub-blocks 305$_0$-305$_3$ in the block 300. In one embodiment, each of the plurality of logical select gate layers 150 comprises respective select gate devices associated with each of the plurality of sub-blocks 305$_0$-305$_3$, and the respective select gate devices in each layer are controlled by a respective one of the plurality of control signals (e.g., SGD0-SGD3). In one embodiment, the respective select gate devices in each of the plurality of logical select gate layers 150 are programmed with a threshold voltage pattern, wherein a first half of the respective select gate devices in each logical select gate layer 150 are programmed to a high threshold voltage and a second half of the respective select gate devices in each logical select gate layer 150 are programmed to a low threshold voltage, and wherein a first half of the select gate devices associated with each sub-block are programmed to the high threshold voltage and a second half of the select gate devices associated with each sub-block are programmed to the low threshold voltage. In one embodiment, the respective select gate devices in each of the plurality of logical select gate layers 150 are programmed with the threshold voltage pattern using a plurality of deintegrated select gate devices 310$_0$-310$_3$ positioned at a source-side of the block 300, wherein the plurality of deintegrated select gate devices 310$_0$-310$_3$ are associated with respective sub-blocks and are physically segregated from one another. Thus, the application of control signals (e.g., SGD0, SGD1, SGD2, SGD3) from local media controller 135 having specific voltages on the wordlines can selectively activate one of the sub-blocks 305$_0$-305$_3$ at a time.

At operation 425, a program signal is applied. For example, the control logic can cause a program signal to be applied to a selected wordline $WL_N$ of the block 300 to program at least the portion of the data to a memory cell in the first sub-block 305$_0$ and associated with the selected wordline. Since the channel voltage in sub-block 305$_0$ is at the ground voltage, the gate to channel voltage differential (e.g., Vpgm-GND) is large enough that memory cell 308$_N$ can be programmed.

Figure 5:
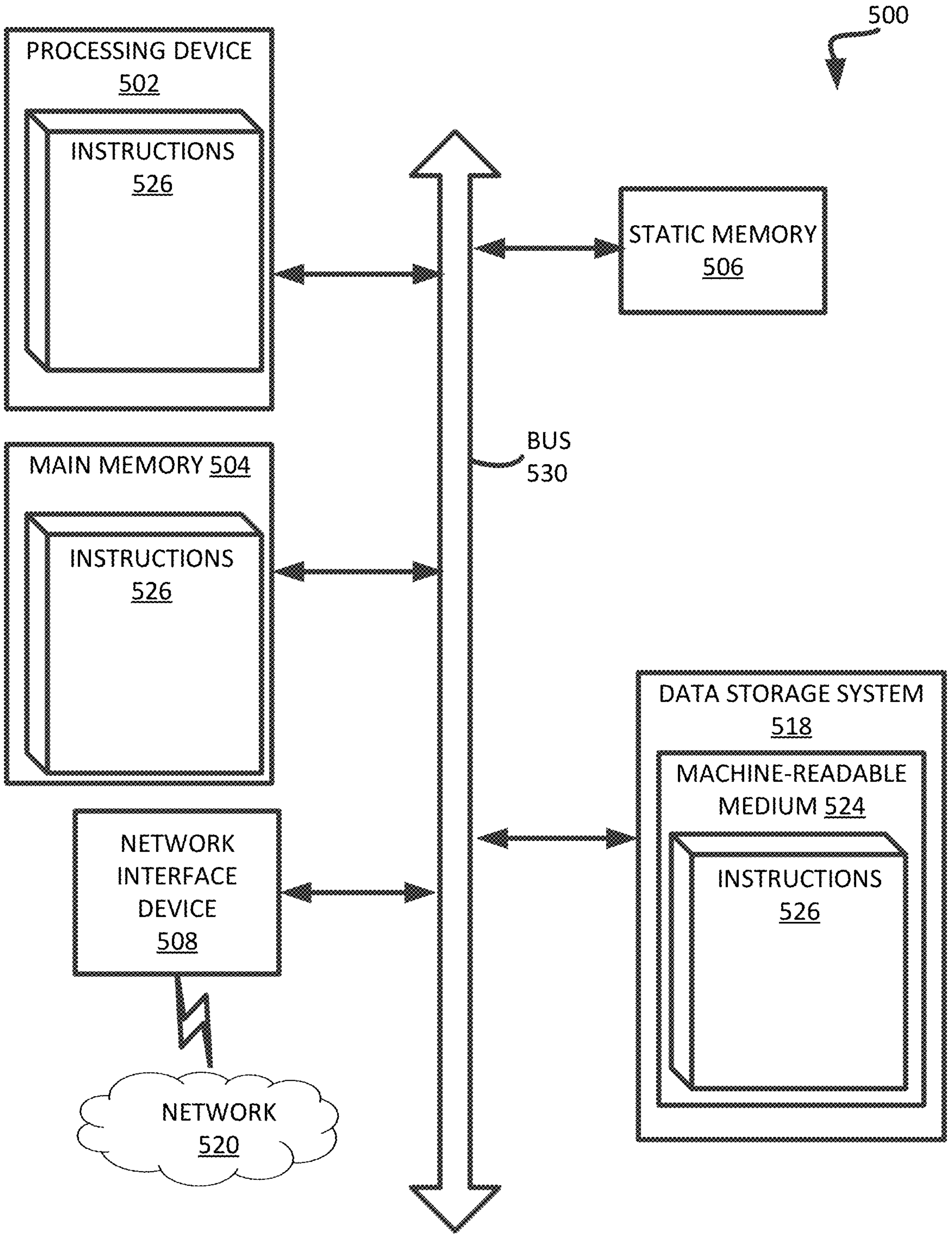
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the local media controller 135 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to the local media controller 135 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:

a memory array; and control logic, operatively coupled with the memory array, to perform operations comprising:

causing a plurality of control signals to be applied to a plurality of logical select gate layers positioned at a drain-side of a segment of the memory array to activate a first sub-portion of the segment; and causing a program signal to be applied to a selected wordline of the segment to program data to a memory cell in the first sub-portion of the segment and associated with the selected wordline.

2. The memory device of claim 1, wherein the plurality of logical select gate layers is disposed between a common bitline shared by a plurality of sub-portions of the segment and the selected wordline.

3. The memory device of claim 2, wherein a number of logical select gate layers in the segment is greater than or equal to a number of sub-portions of the segment.

4. The memory device of claim 2, wherein each of the plurality of logical select gate layers comprises respective select gate devices associated with each of the plurality of sub-portions, and wherein the respective select gate devices in each layer are controlled by a respective one of the plurality of control signals.

5. The memory device of claim 4, wherein the respective select gate devices in each of the plurality of logical select gate layers are programmed with a threshold voltage pattern, wherein a first half of the respective select gate devices in each logical select gate layer are programmed to a high threshold voltage and a second half of the respective select gate devices in each logical select gate layer are programmed to a low threshold voltage, and wherein a first half of the select gate devices associated with each sub-portion are programmed to the high threshold voltage and a second half of the select gate devices associated with each sub-portion are programmed to the low threshold voltage.

6. The memory device of claim 5, wherein the respective select gate devices in each of the plurality of logical select gate layers are programmed with the threshold voltage pattern using a plurality of deintegrated select gate devices positioned at a source-side of the segment, wherein the plurality of deintegrated select gate devices are associated with respective sub-portions and are physically segregated from one another.

7. The memory device of claim 2, wherein the control logic is to perform operations further comprising:

responsive to receiving a request to program the data to the segment, causing a control signal to be applied to a logical select gate control layer to activate all of the plurality of sub-portions of the segment, wherein the logical select gate control layer is disposed between the plurality of logical select gate layers and the selected wordline.

8. A method comprising:

causing a plurality of control signals to be applied to a plurality of logical select gate layers positioned at a drain-side of a segment of a memory array of a memory device to activate a first sub-portion of the segment; and causing a program signal to be applied to a selected wordline of the segment to program data to a memory cell in the first sub-portion of the segment and associated with the selected wordline.

9. The method of claim 8, wherein the plurality of logical select gate layers is disposed between a common bitline shared by a plurality of sub-portions of the segment and the selected wordline.

10. The method of claim 9, wherein a number of logical select gate layers in the segment is greater than or equal to a number of sub-portions of the segment.

11. The method of claim 9, wherein each of the plurality of logical select gate layers comprises respective select gate devices associated with each of the plurality of sub-portions, and wherein the respective select gate devices in each layer are controlled by a respective one of the plurality of control signals.

12. The method of claim 11, wherein the respective select gate devices in each of the plurality of logical select gate layers are programmed with a threshold voltage pattern, wherein a first half of the respective select gate devices in each logical select gate layer are programmed to a high threshold voltage and a second half of the respective select gate devices in each logical select gate layer are programmed to a low threshold voltage, and wherein a first half of the select gate devices associated with each sub-portion are programmed to the high threshold voltage and a second half of the select gate devices associated with each sub-portion are programmed to the low threshold voltage.

13. The method of claim 12, wherein the respective select gate devices in each of the plurality of logical select gate layers are programmed with the threshold voltage pattern using a plurality of deintegrated select gate devices positioned at a source-side of the segment, wherein the plurality of deintegrated select gate devices are associated with respective sub-portions and are physically segregated from one another.

14. The method of claim 9, further comprising:

responsive to receiving a request to program the data to the segment, causing a control signal to be applied to a logical select gate control layer to activate all of the plurality of sub-portions of the segment, wherein the logical select gate control layer is disposed between the plurality of logical select gate layers and the selected wordline.

15. A memory device comprising:

a memory array comprising a segment, the segment comprising a plurality of wordlines and a number of sub-portions each comprising a plurality of memory cells associated with the plurality of wordlines, wherein the memory array further comprises a number of logical select gate layers positioned at a drain-side of the segment to selectively activate individual sub-portions of the segment responsive to received control signals.

16. The memory device of claim 15, wherein the number of logical select gate layers is disposed between a common bitline shared by the plurality of sub-portions and the plurality of wordlines.

17. The memory device of claim 15, wherein each of the number of logical select gate layers comprises respective select gate devices associated with each of the plurality of sub-portions, and wherein the respective select gate devices in each layer are controlled by a respective one of the received control signals.

18. The memory device of claim 17, wherein the respective select gate devices in each of the number of logical select gate layers are programmed with a threshold voltage pattern, wherein a first half of the respective select gate devices in each logical select gate layer are programmed to a high threshold voltage and a second half of the respective select gate devices in each logical select gate layer are programmed to a low threshold voltage, and wherein a first half of the select gate devices associated with each sub-portion are programmed to the high threshold voltage and a second half of the select gate devices associated with each sub-portion are programmed to the low threshold voltage.

19. The memory device of claim 18, wherein the memory array further comprises a plurality of deintegrated select gate devices positioned at a source-side of the segment, and wherein the plurality of deintegrated select gate devices are associated with respective sub-portions and are physically segregated from one another.

20. The memory device of claim 15, wherein the memory array further comprises a logical select gate control layer to activate all of the plurality of sub-portions of the segment responsive to a received control signal, and wherein the logical select gate control layer is disposed between the number of logical select gate layers and the plurality of wordlines.

* * * * *